United States Patent
Okawa et al.

(10) Patent No.: US 9,985,120 B2
(45) Date of Patent: May 29, 2018

(54) BIPOLAR TRANSISTOR (71) Applicant: TOYOTA JIDOSHA KABUSHIKI KAISHA, Toyota-shi, Aichi-ken (JP)

(72) Inventors: Takashi Okawa, Nisshin (JP); Hiroomi Eguchi, Seto (JP); Hiromichi Kinpara, Seto (JP); Satoshi Ikeda, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 26 days.

(21) Appl. No.: 15/025,315

(22) PCT Filed: Aug. 27, 2014

(86) PCT No.: PCT/JP2014/072475
§ 371 (c)(1),
(2) Date: Mar. 28, 2016

(87) PCT Pub. No.: WO2015/060005
PCT Pub. Date: Apr. 30, 2015

(65) Prior Publication Data
US 2016/0233323 A1    Aug. 11, 2016

(30) Foreign Application Priority Data

Oct. 21, 2013 (JP) .................. 2013-218237

(51) Int. Cl.
*H01L 29/66* (2006.01)
*H01L 29/735* (2006.01)
(Continued)

(52) U.S. Cl.
CPC ........ *H01L 29/735* (2013.01); *H01L 29/0623* (2013.01); *H01L 29/1008* (2013.01)

(58) Field of Classification Search
CPC ... H01L 29/73; H01L 29/7322; H01L 29/735; H01L 29/0623; H01L 29/1008
See application file for complete search history.

(56) References Cited

U.S. PATENT DOCUMENTS 7,755,168 B2 * 7/2010 Terashima .......... H01L 29/0692
257/565
8,847,358 B2 * 9/2014 Lin ..................... H01L 29/6625
257/560
(Continued)

FOREIGN PATENT DOCUMENTS

JP    H05-21442 A    1/1993
JP    2014-103193 A  6/2014

OTHER PUBLICATIONS

Nov. 17, 2017 Office Action issued in U.S. Appl. No. 15/025,391.
Mar. 1, 2018 Notice of Allowance issued in U.S. Appl. No. 15/025,391.

*Primary Examiner* — Joseph C Nicely
*Assistant Examiner* — Tuan A Hoang
(74) *Attorney, Agent, or Firm* — Oliff PLC (57) ABSTRACT

Disclosed herein is a bipolar transistor capable of improving a current amplification rate while improving voltage resistance. A bipolar transistor is provided with a p-type emitter region, a p-type collector region, an n-type base region located between the emitter region and the collector region, a p-type first embedded region located below the base region, and an n-type region having a lower n-type impurity concentration than the base region, being in contact with the emitter region, the collector region, the base region and the first embedded region, separating the emitter region from the base region and the first embedded region, and separating the collector region from the base region and the first embedded region. A part of the base region projects out toward a collector region side than the first embedded region does.

4 Claims, 6 Drawing Sheets

(51) Int. Cl.
*H01L 29/06* (2006.01)
*H01L 29/10* (2006.01)

(56) References Cited

U.S. PATENT DOCUMENTS

2012/0098096 A1* 4/2012 Lin .................... H01L 29/6625
                                                    257/565
2015/0097265 A1* 4/2015 Lin ...................... H01L 29/735
                                                    257/526

* cited by examiner

BIPOLAR TRANSISTOR

TECHNICAL FIELD

Cross Reference to Related Application

The present application is a related application of Japanese Patent Application No. 2013-218237 filed on Oct. 21, 2013, and claims priority to this Japanese Patent Application, the entire contents of which are hereby incorporated by reference into the present application.

The technique disclosed herein relates to a bipolar transistor.

BACKGROUND ART

For example, Japanese Patent Application Publication No. H5-21442 (hereafter referred to as Patent Document 1) discloses a lateral pnp transistor. In this pnp transistor, a $p^+$ type second collector region is provided under a collector region. Due to this, a moving distance of carriers (holes) is shortened, and a current amplification rate is improved.

SUMMARY OF INVENTION

Technical Problem

A bipolar transistor with a structure that arranges a base region between a collector region and an emitter region is also known. In the bipolar transistor with this structure, there is an advantage of being able to improve voltage resistance by securing a long distance between the collector region and the emitter region. However, due to the long distance between the collector region and the emitter region, a moving distance of carriers also becomes long, and there are cases in which the current amplification rate decreases.

In the present description, a bipolar transistor that can improve the voltage resistance while improving its current amplification rate is disclosed.

Solution to Technical Problem

An aspect of a technique described herein is a bipolar transistor comprising a semiconductor substrate. The semiconductor substrate comprises: a p-type emitter region located in a part of a front surface of the semiconductor substrate; a p-type collector region located in a part of the front surface of the semiconductor substrate; an n-type base region located between the emitter region and the collector region in a part of the front surface of the semiconductor substrate; a p-type first embedded region located below the base region; and an n-type region having a lower n-type impurity concentration than the base region, being in contact with the emitter region, the collector region, the base region and the first embedded region, separating the emitter region from the base region and the first embedded region, and separating the collector region from the base region and the first embedded region. A part of the base region projects out toward a collector region side than the first embedded region does.

In the above bipolar transistor, the base region is arranged between the collector region and the emitter region, so a distance between the collector region and the emitter region can be secured long, and thus can improve the voltage resistance. Further, there is the p-type first embedded region provided under the n-type base region in the semiconductor layer. Here, "front surface" means one of two surfaces of the semiconductor substrate. "Under" means a side that is farther away from the front surface. The same applies throughout the description hereafter. In a case where carriers (holes) move between emitter and collector, electrical charges and the carriers are not bound together in the first embedded region and thus no loss is generated. Due to this, decrease in current amplification rate can be suppressed. According to the bipolar transistor as above, the voltage resistance can be improved at the same time as improving the current amplification rate.

Further, in the above bipolar transistor, a part of the base region projects out toward the collector region side than the first embedded region does. Due to this, a depletion layer generated between the collector and the base when the bipolar transistor is turned off can be suppressed from reaching the first embedded region. That is, depletion of the first embedded region can be suppressed. Due to this, upon switching the bipolar transistor from an off state to an on state, an amount of holes supplied to the depleted region can be reduced, so a turn-on time can be shortened.

The semiconductor substrate may further comprise a p-type second embedded region located below the first embedded region, and separated from the first embedded region by the n-type region.

According to this configuration, a loss generated upon when the holes move between the emitter and the collector can further be reduced. Due to this, the current amplification rate can further be improved.

Another aspect of the technique described herein is a bipolar transistor comprising a semiconductor substrate. The semiconductor substrate comprises: an n-type emitter region located in a part of a front surface of the semiconductor substrate; an n-type collector region located in a part of the front surface of the semiconductor substrate; a p-type base region located between the emitter region and the collector region in a part of the front surface of the semiconductor substrate; an n-type first embedded region located below the base region; and a p-type region having a lower p-type impurity concentration than the base region, being in contact with the emitter region, the collector region, the base region and the first embedded region, separating the emitter region from the base region and the first embedded region, and separating the collector region from the base region and the first embedded region. A part of the base region projects out toward an emitter region side than the first embedded region does.

In this bipolar transistor as well, the voltage resistance can be improved at the same time as improving the current amplification rate. Notably, in this bipolar transistor, the carriers moving between the emitter and the collector are electrons.

Further, in the above bipolar transistor, a part of the base region projects out toward the emitter region side than the first embedded region does. Due to this, the depletion layer generated between the emitter and the base when the bipolar transistor is turned off can be suppressed from reaching the first embedded region. That is, the depletion of the first embedded region can be suppressed. Due to this, upon switching the bipolar transistor from the off state to the on state, the amount of electrons supplied to the depleted region can be reduced, so the turn-on time can be shortened.

The semiconductor substrate may further comprise an n-type second embedded region located below the first embedded region, and separated from the first embedded region by the p-type region.

According to this configuration, a loss generated upon when the electrons move between the emitter and the collector can further be reduced. Due to this, the current amplification rate can further be improved.

BRIEF DESCRIPTION OF DRAWINGS

FIG. 2 is a schematic view of a state where the bipolar transistor of the first embodiment is turned of.

DESCRIPTION OF EMBODIMENTS (First Embodiment)

Figure 1:
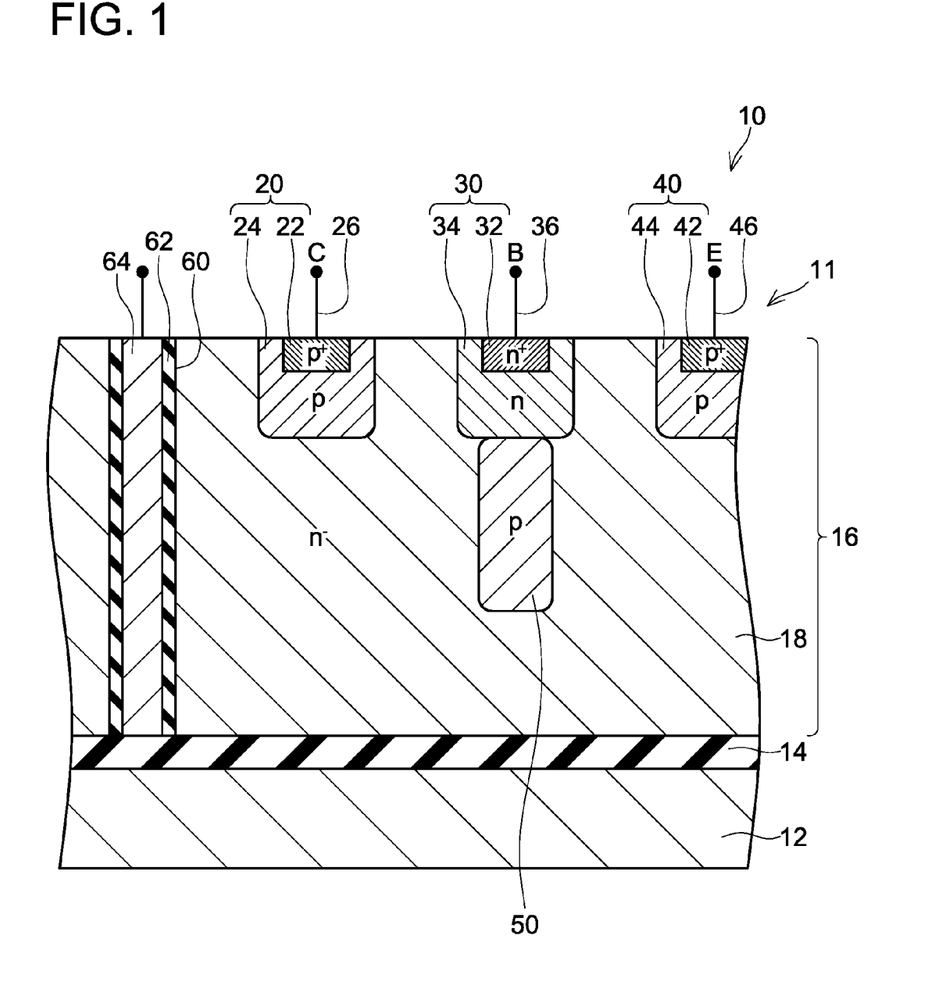
FIG. 1 is a cross sectional view of a bipolar transistor of a first embodiment.

As shown in FIG. 1, a bipolar transistor 10 of the present embodiment comprises a semiconductor substrate 11 composed primarily of Si. The semiconductor substrate 11 comprises a rear surface layer 12, an embedded insulating film 14 provided on a front surface side of the rear surface layer 12 (upper side of FIG. 1), and a semiconductor layer 16 provided on the front surface side of the embedded insulating film 14. Further, electrodes 26, 36, 46 and metal wirings and the like (not shown) are provided on a front surface of the semiconductor substrate 11. The bipolar transistor 10 of the present embodiment is a lateral pnp transistor.

A p-type emitter region 40, a p-type collector region 20, an n-type base region 30, a p-type first embedded region 50, and an n-type region 18 are provided in the semiconductor layer 16. The emitter region 40, the collector region 20, and the base region 30 are provided respectively at parts of the front surface of the semiconductor layer 16. Further, the base region 30 is provided between the emitter region 40 and the collector region 20. The first embedded region 50 is provided below the base region 30.

An n-type impurity concentration of the n-type region 18 is lower than an n-type impurity concentration of a low-concentration region 34 of the base region 30. Here, the term "impurity concentration" means an average impurity concentration in the relevant region. Hereinbelow, the same applies to the case of referring to "impurity concentration" in this description. The n-type region 18 makes contact with the emitter region 40, the collector region 20, the base region 30, and the first embedded region 50. The n-type region 18 separates the emitter region 40 from the base region 30, the first embedded region 50, and the collector region 20. The n-type region 18 separates the collector region 20 from the base region 30, the first embedded region 50, and the emitter region 40.

The emitter region 40 comprises a high-concentration region 42 having a high p-type impurity concentration and a low-concentration region 44 having a lower p-type impurity concentration than the high-concentration region 42. The emitter region 40 is provided in an island-shape in a region exposed on the front surface of the semiconductor layer 16. The emitter electrode 46 is connected to a front surface of the emitter region 40.

The collector region 20 comprises a high-concentration region 22 having a high p-type impurity concentration and a low-concentration region 24 having a lower p-type impurity concentration than the high-concentration region 22. The collector region 20 is provided in an island-shape in a region exposed on the front surface of the semiconductor layer 16. The collector region 20 is provided with an interval from the emitter region 40. In the present embodiment, a distance between the collector region 20 and the emitter region 40 is secured long because of the base region 30 arranged between the collector region 20 and the emitter region 40. The collector electrode 26 is connected to a front surface of the collector region 20.

The base region 30 comprises a high-concentration region 32 having a high n-type impurity concentration and a low-concentration region 34 having a lower n-type impurity concentration than the high-concentration region 32. The high-concentration region 32 and the low-concentration region 34 are both regions formed by injecting n-type impurities to the n-type region 18. Due to this, the n-type impurity concentration of the high-concentration region 32 is higher than an n-type impurity concentration of the n-type region 18. Further, the n-type impurity concentration of the low-concentration region 34 is higher than the n-type impurity concentration of the n-type region 18. In the n-type region 18, the concentration of the n-type impurities is substantially uniform, whereas the base region 30 has the impurity concentration that is even higher than the aforementioned uniform n-type impurity concentration. In the present embodiment, the n-type impurity concentration of the n-type region 18 is less than $1 \times 10^{15}$ atoms/cm$^3$, and the n-type impurity concentration of the base region 30 is equal to or greater than $1 \times 10^{17}$ atoms/cm$^3$. The base region 30 is also provided in an island-shape in a region exposed on the front surface of the semiconductor layer 16. As described above, the base region 30 is provided between the collector region 20 and the emitter region 40. The base electrode 36 is connected to a front surface of the base region 30.

A part of the base region 30 projects out further toward a collector region 20 side than the first embedded region 50 does, and also projects out further toward an emitter region 40 side than the first embedded region 50 does. In other words, the base region 30 has a wider width than the first embedded region 50 in a width direction (left and right direction in FIG. 1) of the semiconductor substrate 11. Yet in other words, a side surface of the first embedded region 50 on the collector region 20 side is located closer to the emitter region 40 in the width direction than a side surface of the base region 30 on the collector region 20 side is to the emitter region 40, and a side surface of the first embedded region 50 on the emitter region 40 side is located closer to the collector region 20 in the width direction than a side surface of the base region 30 on the emitter region 40 side is to the collector region 20.

The first embedded region 50 is located under the base region 30 as aforementioned. In the present embodiment, the first embedded region 50 is provided so as to make contact with a lower end of the base region 30.

An isolation trench 60 for isolating the bipolar transistor 10 from other regions (not shown) is provided in the semiconductor layer 16. The isolation trench 60 extends downward from the front surface of the semiconductor layer 16, and reaches a front surface of the embedded insulating film 14. An isolation insulating layer 62 that covers an inner wall of the isolation trench 60 is provided in the isolation trench 60. An embedded electrode 64 is provided inside the isolation insulating layer 62. Although not shown in FIG. 1, in the present embodiment, the embedded electrode 64 is connected to the collector electrode 26. Due to this, the embedded electrode 64 has the same potential as the collector electrode 26.

Next, an operation of the bipolar transistor 10 of the present embodiment will be described. The bipolar transistor 10 turns on when a voltage that charges the emitter electrode 46 positively (that is, forward voltage for the bipolar transistor 10) is applied between the emitter electrode 46 and the collector electrode 26 and a predetermined ON potential is applied to the base electrode 36. That is, electrons move through the n-type region 18 from the collector region 20 toward the emitter region 40, and carriers (holes) move from the emitter region 40 toward the collector region 20. Due to this, current flows from the emitter electrode 46 to the collector electrode 26. Most of the holes pass through the first embedded region 50 when they move from the emitter region 40 toward the collector region 20. The electrons and holes are not bound within the first embedded region 50, so no loss is generated. Due to this, a substantial moving distance for the holes is shortened by a length of the first embedded region 50 upon when the holes move from the emitter region 40 to the collector region 20. As a result, a current amplification rate of the bipolar transistor 10 can be improved.

Further, as described above, in the bipolar transistor 10 of the present embodiment, since the base region 30 is arranged between the collector region 20 and the emitter region 40, a long distance between the collector region 20 and the emitter region 40 can be ensured, and the voltage resistance can thereby be improved. Thus, the bipolar transistor 10 has a high voltage resistance and a high current amplification rate.

Figure 2:
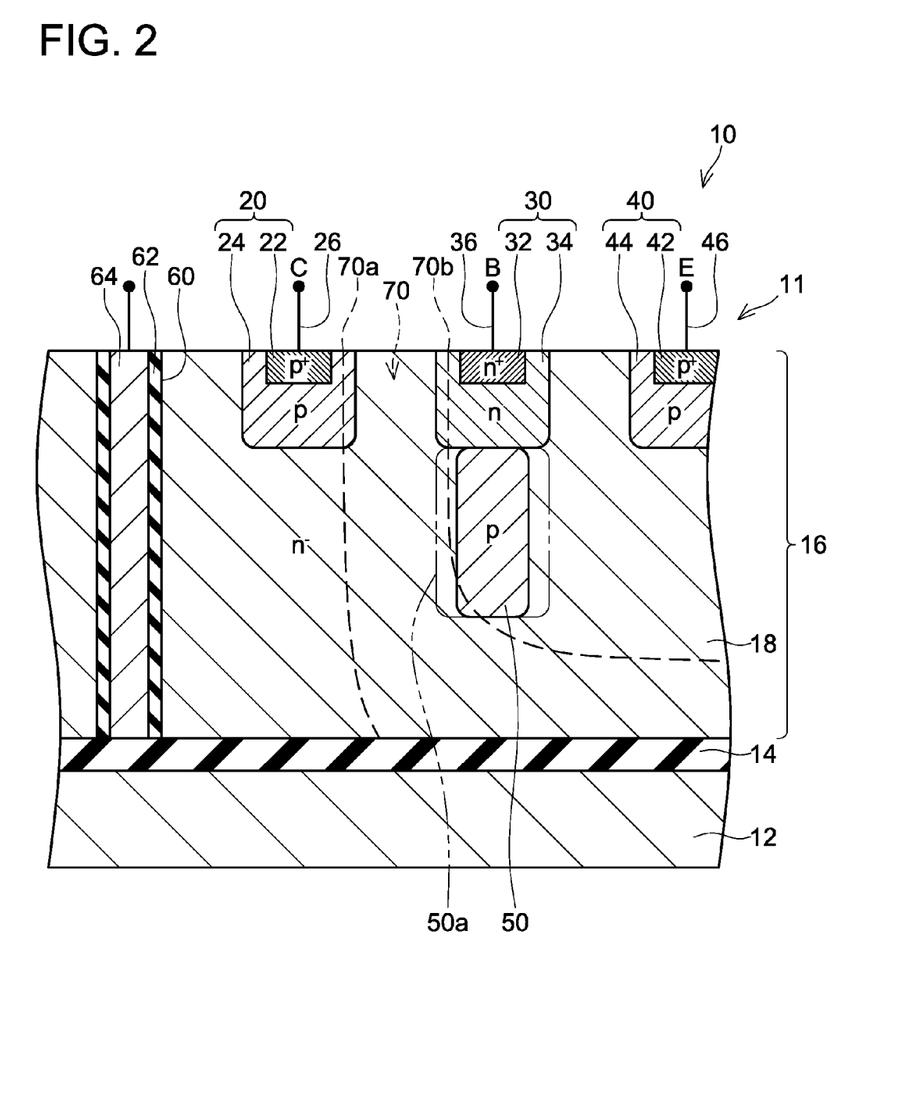

When the potential applied to the emitter electrode 46 and the base electrode 36 is brought to zero while the bipolar transistor 10 is on, the bipolar transistor 10 is turned off. In this case, there is no potential difference between the emitter electrode 46 and the base electrode 36, and the potential of the collector electrode 26 comes to be in a state of being lower than the potential of the emitter electrode 46 and the base electrode 36 (state in which negative potential is applied). In this case, as shown in FIG. 2, a depletion layer 70 is generated between the collector and the base. One end 70a of the depletion layer 70 reaches the low-concentration region 22 of the collector region 20. Further, the other end 70b of the depletion layer 70 reaches the low-concentration region 32 of the base region 30. Further, a part of the end 70b also reaches an inside of a part of the first embedded region 50. Within the first embedded region 50, no hole is present in the part existing within the depletion layer 70 (that is, depleted portion).

Here, as a comparative example, a case will be considered in which a wide first embedded region 50a (as shown in two-dot chain line in FIG. 2) is provided. In this case, a position of an end of the base region 30 on the collector region 20 side substantially matches a position of an end of the first embedded region 50a on the collector region 20 side. In this case, when the other end 70b of the depletion layer 70 reaches the low-concentration region 34 of the base region 30, an entirety of a side surface of the first embedded region 50a closer to the collector region 20 is also depleted. That is, as shown in FIG. 2, a volume of the portion within the first embedded region 50a of the comparative example that has been depleted is larger than a volume of the depleted portion within the first embedded region 50 of the present embodiment. Due to this, in the comparative example, upon switching the bipolar transistor 10 from the off state to the on state, a greater number of holes needs to be provided to the first embedded region 50a that had been depleted during the off time, so turn-on time becomes relatively long.

As above, in the present embodiment, a part of the base region 30 projects out toward the collector region 20 side than the first embedded region 50 does. Due to this, as compared to the configuration of the above comparative example, the depletion of the first embedded region 50 can be suppressed when the bipolar transistor 10 is turned off. Due to this, upon switching the bipolar transistor 10 from the off state to the on state, the number of holes that needs to be supplied to the region which had been depleted is relatively small, so the turn-on time can be relatively shortened.

(Second Embodiment)

Figure 3:
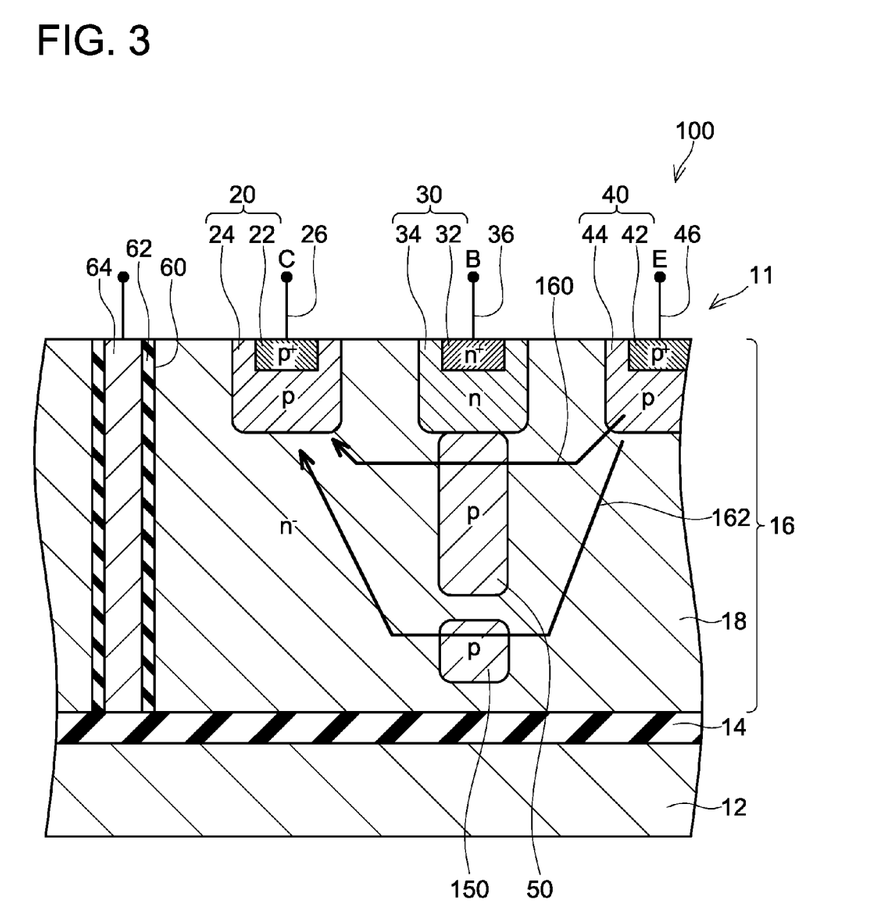
FIG. 3 is a cross sectional view of a bipolar transistor of a second embodiment.

Next, a bipolar transistor 100 of a second embodiment will be described by referring to FIG. 3, by focusing the description primarily on the differences from the first embodiment. The bipolar transistor 100 of the present embodiment has a basic configuration in common to the first embodiment. However, in the present embodiment, as shown in FIG. 3, a p-type second embedded region 150 is provided, under the first embedded region 50 with an interval from the first embedded region 50.

The bipolar transistor 100 of the present embodiment can achieve substantially the same effects as the bipolar transistor 10 of the first embodiment. Further, in the present embodiment, as described above, the p-type second embedded region 150 is provided under the first embedded region 50. Due to this, in a case where the bipolar transistor 100 is turned on and the carriers (holes) move from the emitter region 40 toward the collector region 20, a greater number of holes will be moving through the first and second embedded regions 50, 150. That is, the greater number of holes enables the substantial moving distance to be shortened by lengths of the first and second embedded regions 50, 150. Thus, the current amplification rate can further be improved. Further, passages through which the holes move become more easily dispersed (see arrows 160, 162 in the drawing), so heat generation in the bipolar transistor 100 can also be suppressed.

(Third Embodiment)

Figure 4:
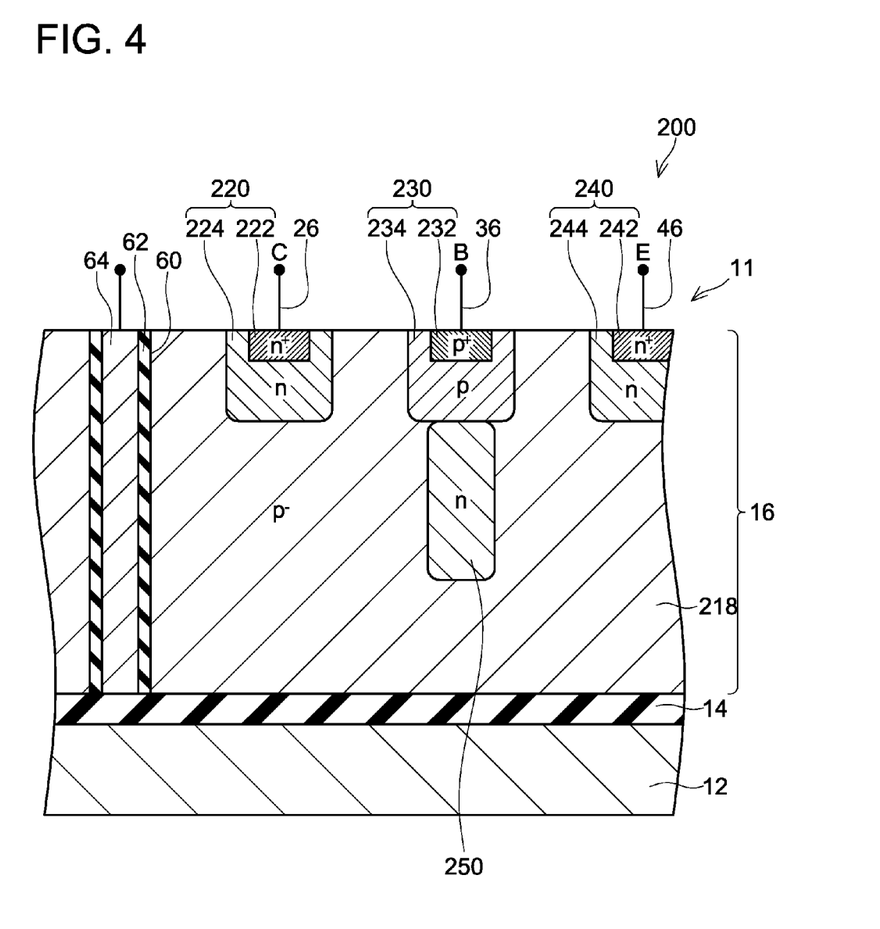
FIG. 4 is a cross sectional view of a bipolar transistor of a third embodiment.

Next, a bipolar transistor 200 of a third embodiment will be described by referring to FIG. 4, by focusing the description primarily on the differences from the first embodiment. The bipolar transistor 200 of the present embodiment differs from the first embodiment in that it is a lateral npn transistor.

In the present embodiment, an n-type emitter region 240, an n-type collector region 220, a p-type base region 230, an n-type first embedded region 250, and a p-type region 218 are provided in the semiconductor layer 16. Shapes and arrangements of the respective regions are similar to the shapes and arrangements of the first embodiment.

A p-type impurity concentration of the p-type region 218 is lower than a p-type impurity concentration of a low-concentration region 234 of the base region 230. The emitter region 240 comprises a high-concentration region 242 with a high n-type impurity concentration, and a low-concentration region 244 with a low n-type impurity concentration compared to the high-concentration region 242. The collector region 220 comprises a high-concentration region 222 with a high n-type impurity concentration, and a low-concentration region 224 with a low n-type impurity concentration compared to the high-concentration region 222. The base region 230 comprises a high-concentration region 232 with a high p-type impurity concentration, and the low-concentration region 234 with a low p-type impurity concentration compared to the high-concentration region 232. Both the high-concentration region 232 and the low-concentration region 234 are regions formed by injecting p-type impurities to the p-type region 218. Due to this, the p-type impurity concentration of the high-concentration region 232 is higher than a p-type impurity concentration of the p-type region 218. Further, the p-type impurity concentration of the low-concentration region 234 is higher than the p-type impurity concentration of the p-type region 218. In the p-type region 218, the concentration of the p-type impurities is substantially uniform, whereas the base region 230 has the impurity concentration that is even higher than the aforementioned uniform p-type impurity concentration. In the present embodiment, the p-type impurity concentration of the p-type region 218 is less than $1 \times 10^{15}$ atoms/cm$^3$, and the p-type impurity concentration of the base region 230 is equal to or greater than $1 \times 10^{17}$ atoms/cm$^3$. The first embedded region 250 is provided under the base region 230. The first embedded region 250 is provided so as to make contact with a lower end of the base region 230. A part of the base region 230 projects out toward an emitter region 240 side than the first embedded region 250 does, and further projects out toward a collector region 220 side than the first embedded region 250 does.

Next, an operation of the bipolar transistor 200 of the present embodiment will be described. The bipolar transistor 200 turns on when a voltage that charges the collector electrode 26 positively (that is, forward voltage for the bipolar transistor 200) is applied between the emitter electrode 46 and the collector electrode 26 and a predetermined ON potential is applied to the base electrode 36. That is, holes move through the p-type region 218 from the collector region 220 toward the emitter region 240, and carriers (electrons) move from the emitter region 240 toward the collector region 220. Due to this, current flows from the collector electrode 26 to the emitter electrode 46. Most of the electrons pass through the first embedded region 250 when they move from the emitter region 240 toward the collector region 220. The electrons and holes are not bound within the first embedded region 250, so no loss is generated. Due to this, a substantial moving distance for the electrons is shortened by a length of the first embedded region 250 upon when the electrons move from the emitter region 240 to the collector region 220. As a result, a current amplification rate of the bipolar transistor 200 can be improved.

Further, in the present embodiment also, since the base region 230 is arranged between the collector region 220 and the emitter region 240, a long distance can be ensured between the collector region 220 and the emitter region 240, and a voltage resistance can be improved. Thus, in the bipolar transistor 200 of the present embodiment also, the voltage resistance is high, and the current amplification rate is high.

Figure 5:
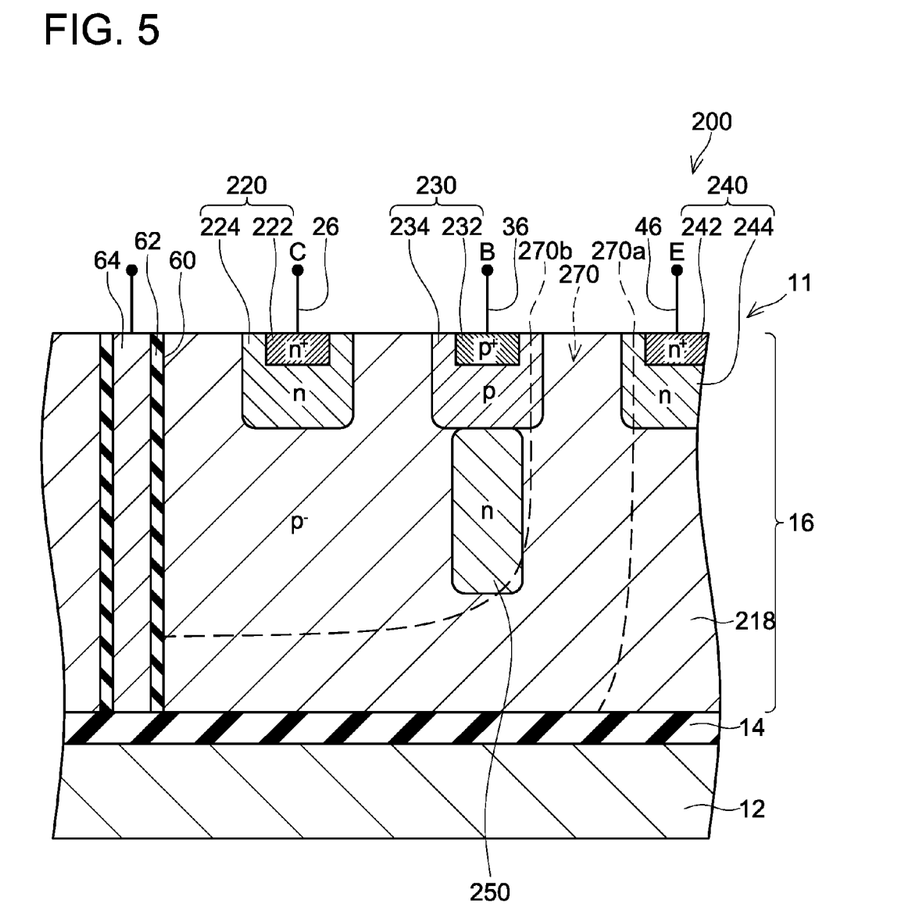
FIG. 5 is a schematic view of a state where the bipolar transistor of the third embodiment is turned off.

When the potential applied to the collector electrode 26 and the base electrode 36 is brought to zero, the bipolar transistor 200 is turned off. In this case, there is no potential difference between the collector electrode 26 and the base electrode 36, and the potential of the emitter electrode 46 comes to be in a state of being lower than the potential of the collector electrode 26 and the base electrode 36 (state in which negative potential is applied). In this case, as shown in FIG. 5, a depletion layer 270 is generated between the emitter and the base. One end 270a of the depletion layer 270 reaches the low-concentration region 242 of the emitter region 240. Further, the other end 270b of the depletion layer 270 reaches the low-concentration region 232 of the base region 230. Further, a part of the end 270b also reaches an inside of a part of the first embedded region 250. Within the first embedded region 250, no electron is present in the part existing within the depletion layer 270 (that is, depleted portion).

In the present embodiment, a part of the base region 230 projects out toward the emitter region 240 side than the first embedded region 250 does. Due to this, the depletion of the first embedded region 250 can be suppressed when the bipolar transistor 200 is turned off. Due to this, upon switching the bipolar transistor 200 from the off state to the on state, the number of elections that needs to be supplied to the region which had been depleted during the of time is relatively small, so the turn-on time can be relatively shortened.

(Fourth Embodiment)

Figure 6:
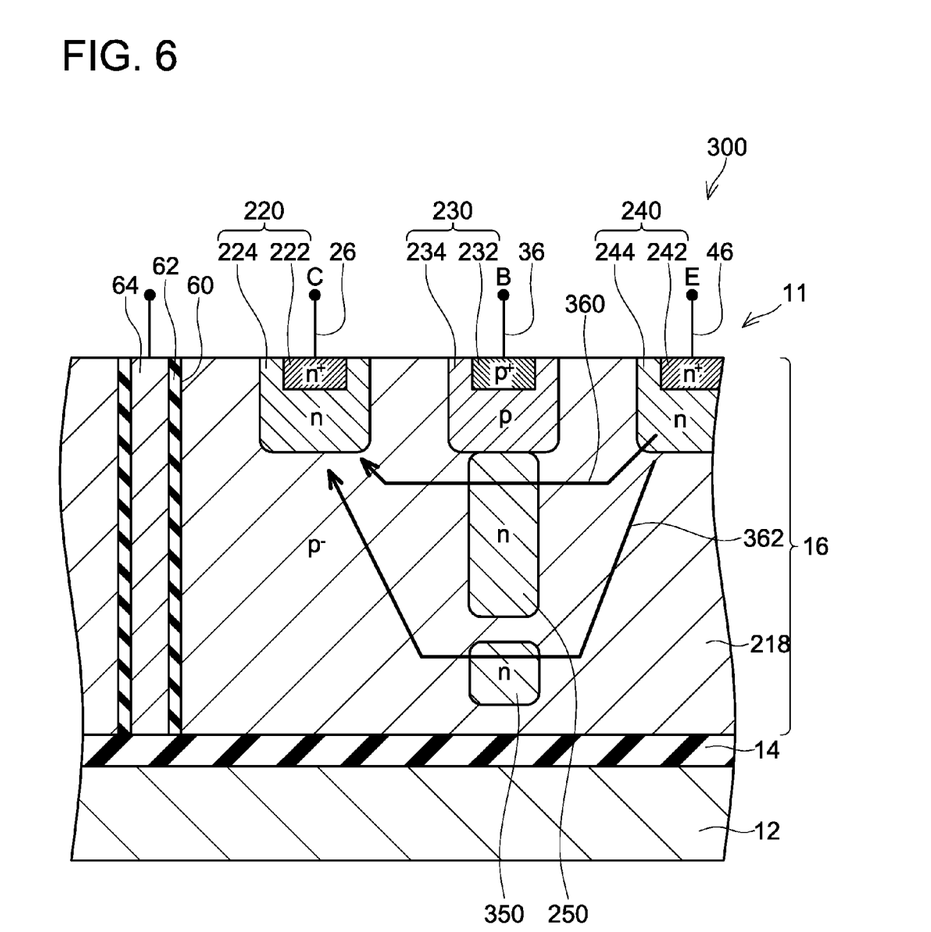
FIG. 6 is a cross sectional view of a bipolar transistor of a fourth embodiment.

Next, a bipolar transistor 300 of a fourth embodiment will be described by referring to FIG. 6, by focusing the description primarily on the differences from the third embodiment. The bipolar transistor 300 of the present embodiment has a basic configuration in common to the third embodiment. However, in the present embodiment, as shown in FIG. 6, an n-type second embedded region 350 is provided under the first embedded region 250 with an interval from the first embedded region 250.

The bipolar transistor 300 of the present embodiment can achieve substantially the same effects as the bipolar transistor 200 of the third embodiment. Further, in the present embodiment, as described above, the second embedded region 350 is provided under the first embedded region 250. Due to this, in a case where the bipolar transistor 300 is turned on and the carriers (electrons) move from the emitter region 240 toward the collector region 220, a greater number of electrons will be moving through the first and second embedded regions 250, 350. That is, the greater number of electrons enables the substantial moving distance to be shortened by the lengths of the first and second embedded regions 250, 350. Thus, the current amplification rate can further be improved. Further, passages through which the electrons move become more easily dispersed (see arrows 360, 362 in the drawing), so heat generation in the bipolar transistor 300 can also be suppressed.

Specific examples of the art disclosed herein have been described in detail, however, these are mere exemplary indications and thus do not limit the scope of the claims. The art described in the claims include modifications and variations of the specific examples presented above. For example, the following variants may be implemented.

(Variant 1)

In the above second embodiment, the p-type first and second embedded regions 50, 150 are provided under the n-type base region 30. Not being limited to this, p-type embedded regions may be provided at three or more different positions under the n-type base region 30. Similarly, in the above fourth embodiment, three or more n-type embedded regions may be provided under the p-type base region 230.

(Variant 2)

In each of the above embodiments, a part of the base region 30 (230) projects out toward the collector region 20 (220) side than the first embedded region 50 (250) does, and also projects out toward the emitter region 40 (240) side than the first embedded region 50 (250) does. Not being limited to this, in the first and second embodiments, a part of the base region 30 may not have to project out toward the emitter region 40 side than the first embedded region 50 does, so long as this part projects out toward the collector region 20 side than the first embedded region 50 does. Similarly, in the third and fourth embodiments, a part of the base region 230 may not have to project out toward the collector region 220 side than the first embedded region 250 does, so long as this part projects out toward the emitter region 240 side than the first embedded region 250 does.

(Variant 3)

In each of the above embodiments, the first embedded region 50 (250) is provided so as to make contact with the lower end of the base region 30 (230). Not being limited to this, the first embedded region 50 (250) may be provided with an interval from the base region 30 (230), so long as it is located under the base region 30 (230).

Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

The invention claimed is:

1. A bipolar transistor comprising:
    a semiconductor substrate,
    wherein the semiconductor substrate comprises:
        a p-type emitter region located in a first part of a front surface of the semiconductor substrate;
        a p-type collector region located in a second part of the front surface of the semiconductor substrate;
        an n-type base region located between the emitter region and the collector region in a third part of the front surface of the semiconductor substrate;
        a p-type first embedded region located below the base region; and
        an n-type region having a lower n-type impurity concentration than the base region, being in contact with the emitter region, the collector region, the base region and the first embedded region, separating the emitter region from the base region and the first embedded region, and separating the collector region from the base region and the first embedded region,
    wherein a part of the base region projects out toward a collector region side more than the first embedded region does.

2. The bipolar transistor as in claim 1, wherein
the semiconductor substrate further comprises a p-type second embedded region located below the first embedded region, and separated from the first embedded region by the n-type region.

3. A bipolar transistor comprising:
    a semiconductor substrate,
    wherein the semiconductor substrate comprises:
        an n-type emitter region located in a first part of a front surface of the semiconductor substrate;
        an n-type collector region located in a second part of the front surface of the semiconductor substrate;
        a p-type base region located between the emitter region and the collector region in a third part of the front surface of the semiconductor substrate;
        an n-type first embedded region located below the base region; and
        a p-type region having a lower p-type impurity concentration than the base region, being in contact with the emitter region, the collector region, the base region and the first embedded region, separating the emitter region from the base region and the first embedded region, and separating the collector region from the base region and the first embedded region,
    wherein a part of the base region projects out toward an emitter region side more than the first embedded region does.

4. The bipolar transistor as in claim 3, wherein
the semiconductor substrate further comprises an n-type second embedded region located below the first embedded region, and separated from the first embedded region by the p-type region.

* * * * *